(12) United States Patent
Ranmuthu

(10) Patent No.: US 11,063,146 B2
(45) Date of Patent: Jul. 13, 2021

(54) BACK-TO-BACK POWER FIELD-EFFECT TRANSISTORS WITH ASSOCIATED CURRENT SENSORS

(71) Applicant: Texas Instruments Incorporated, Dallas, TX (US)

(72) Inventor: Indumini Ranmuthu, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/368,313

(22) Filed: Mar. 28, 2019

(65) Prior Publication Data

US 2020/0227551 A1    Jul. 16, 2020

Related U.S. Application Data

(60) Provisional application No. 62/791,013, filed on Jan. 10, 2019.

(51) Int. Cl.
*H01L 29/78* (2006.01)
*G01R 19/00* (2006.01)
(Continued)

(52) U.S. Cl.
CPC ...... *H01L 29/7815* (2013.01); *G01R 19/0092* (2013.01); *G06F 13/4282* (2013.01); *H01L 27/088* (2013.01)

(58) Field of Classification Search
CPC ............... H01L 29/7815; H01L 27/088; H01L 2924/13072; H01L 2924/1306;
(Continued)

(56) References Cited

U.S. PATENT DOCUMENTS 6,977,435 B2    12/2005  Kim et al.
9,922,845 B1    3/2018   Shih
(Continued)

FOREIGN PATENT DOCUMENTS

JP    2008022152 A    1/2008
WO    2018085596 A1   5/2018

OTHER PUBLICATIONS

Search Report for PCT Application No. PCT/US20/12922, dated Mar. 19, 2020, 1 page.
(Continued)

*Primary Examiner* — Galina G Yushina
(74) *Attorney, Agent, or Firm* — Valerie M. Davis; Charles A. Brill; Frank D. Cimino

(57) ABSTRACT

Back-to-back power field-effect transistors with associated current sensors are disclosed. An example apparatus includes a first power field-effect transistor (FET) having a first source, and a second power FET having a second source. The first and second power FETs share a common drain. The first and second sources positioned on a first side of a substrate and the common drain positioned on a second side of the substrate opposite the first side. The example apparatus includes a current sensing FET positioned between a first portion of the first source of the first power FET and a second portion of the first source of the first power FET. The current sensing FET senses a current passing through the first and second power FETs.

34 Claims, 5 Drawing Sheets

(51) Int. Cl.
*G06F 13/42* (2006.01)
*H01L 27/088* (2006.01)

(58) Field of Classification Search
CPC ............... H01L 27/105; H05K 5/0278; H04L
12/40042; G01R 19/0092; G06F 13/4282;
G06F 2213/0042; G06F 2213/3812
See application file for complete search history.

(56) References Cited

U.S. PATENT DOCUMENTS

| | | |
|---|---|---|
| 2012/0104604 A1 | 5/2012 | McCarthy et al. |
| 2013/0200528 A1 | 8/2013 | Lin et al. |
| 2014/0015046 A1* | 1/2014 | Thiele ............... H03K 17/0822 257/334 |
| 2014/0253025 A1* | 9/2014 | Van Wiemeersch .... H02J 50/40 320/108 |
| 2015/0084191 A1 | 3/2015 | Lin et al. |
| 2015/0311169 A1 | 10/2015 | Chuang et al. |
| 2016/0026803 A1 | 1/2016 | Jiang et al. |
| 2017/0030948 A1* | 2/2017 | Baldwin ............... H03K 17/08 |
| 2017/0179278 A1* | 6/2017 | Baldwin ............. H01L 29/0878 |
| 2017/0222459 A1* | 8/2017 | Kang ................. H01R 31/065 |
| 2018/0053665 A1 | 2/2018 | Kuo et al. |
| 2018/0183427 A1* | 6/2018 | Nakajima ........... H01L 29/7815 |
| 2020/0212695 A1* | 7/2020 | Moubedi ............... H02J 7/0045 |

OTHER PUBLICATIONS

JP2008022152A, Machine Translation, 30 pages.
Ranmuthu et al., "Semiconductor Structure and Method for Wafer Scale Chip Package," U.S. Appl. No. 16/009,377, filed Jun. 15, 2018, 30 pages.
Rosson, Jim; Texas Instruments Incorporated, "NanoStar & NanoFree 300um Solder Bump Wafer Chip-Scale Package Application," Application Report, SBVA017—Feb. 2004. 22 pages.
Search Report for PCT Application No. PCT/US19/37155, dated Sep. 12, 2019, 1 page.
Jim Rosson, NanoStarTM & NanoFreeTM 300μm Solder Bump Wafer Chip-Scale Package Application, HighPerformance Analog—MAKE Packaging, Texas Instruments, Application Report, SBVA017—Feb. 2004, 22 pages.

* cited by examiner

US 11,063,146 B2

BACK-TO-BACK POWER FIELD-EFFECT TRANSISTORS WITH ASSOCIATED CURRENT SENSORS

RELATED APPLICATIONS

This patent claims priority to U.S. Provisional Patent Application Ser. No. 62/791,013, which was filed on Jan. 10, 2019, and which is incorporated herein by reference in its entirety.

FIELD OF THE DISCLOSURE

This disclosure relates generally to power transistors, and, more particularly, to back-to-back power field-effect transistors with associated current sensors.

BACKGROUND

Power transistors are transistors used as switches in power electronics. In many existing applications (e.g., USB ports), power switching is accomplished using a discrete (e.g., standalone) transistor that is activated or controlled by a separate, external controller. In many situations, the current passing through a power transistor is monitored by detecting a voltage drop across a resistor positioned in series with the power transistor.

SUMMARY

An example apparatus includes a first power field-effect transistor (FET) having a first source, and a second power FET having a second source. The first and second power FETs share a common drain. The first and second sources positioned on a first side of a substrate and the common drain positioned on a second side of the substrate opposite the first side. The example apparatus includes a current sensing FET positioned between a first portion of the first source of the first power FET and a second portion of the first source of the first power FET. The current sensing FET senses a current passing through the first and second power FETs.

An example apparatus includes a power transistor assembly including back-to-back power field-effect transistors (FETs) and including a current sensing FET integrated within the power FETs. The apparatus also including a controller to control operation of the power FETs, where the power FETs integrated with the controller in a single package.

An example apparatus includes a first power field-effect transistor (FET) having a first source coupled to a first doped region. The example apparatus includes a second power FET having a second source coupled to a second doped region. The first doped region is positioned adjacent a second doped region on a common substrate associated with a common drain for the first and second power FETs. The substrate has a non-uniform current density distribution when current is passing between the first and second power FETs. The example apparatus includes a current sensing FET having a third source coupled to a third doped region. The third doped region is positioned on the common substrate at a first location. The current sensing FET measures the current passing between the first and second power FETs at the first location.

An example electronic device includes a universal serial bus (USB) connector. The example electronic device includes an internal circuitry connector communicatively coupling the USB connector to internal circuitry of the electronic device. The example electronic device includes a first power field-effect transistor (FET) having a first source. The example electronic device includes a second power FET having a second source. The first and second sources positioned on a first side of a substrate and the common drain positioned on a second side of the substrate opposite the first side. The first and second power FETs are electrically coupled between the USB connector and the internal circuitry connector to pass current from the internal circuitry to the external device when the first and second power FETs are turned on. The example electronic device includes a current sensing FET integrated within the first and second power FETs.

Figure 1:
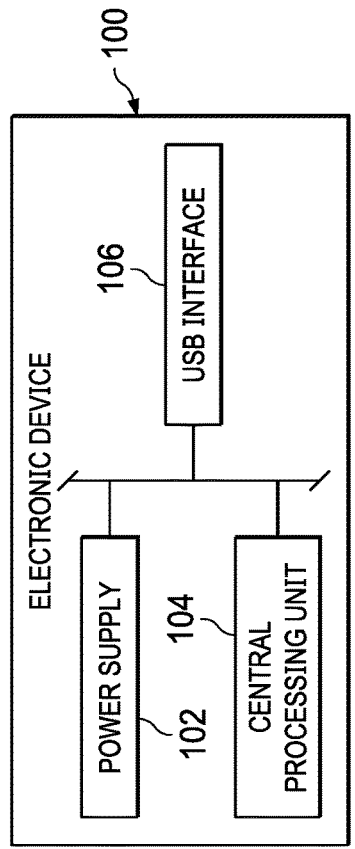
FIG. 1 illustrates an example electronic device constructed in accordance with teachings disclosed herein.

The figures are not to scale. Instead, the thickness of the layers or regions may be enlarged in the drawings. In general, the same reference numbers will be used throughout the drawing(s) and accompanying written description to refer to the same or like parts. As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween. Stating that any part is in contact with another part means that there is no intermediate part between the two parts. Although the figures show layers and regions with clean lines and boundaries, some or all of these lines and/or boundaries may be idealized. In reality, the boundaries and/or lines may be unobservable, blended, and/or irregular.

DETAILED DESCRIPTION

As used herein, the term "above" is used with reference to a bulk region of a base semiconductor substrate (e.g., a semiconductor wafer) on which components of an integrated circuit are formed. Specifically, as used herein, a first component of an integrated circuit is "above" a second component when the first component is farther away from the bulk region of the semiconductor substrate. Likewise, as used herein, a first component is "below" another component when the first component is closer to the bulk region of the semiconductor substrate. As noted above, one component can be above or below another with other components therebetween or while being in direct contact with one another.

In many known electronic devices, power transistors are controlled to switch on or off by a controller that is implemented external to (in a separate integrated circuit (IC) to) the power transistor. However, the connection (e.g., wire bonds and/or clip bonds) between an external controller and one or more associated power transistors creates additional resistance that can reduce the overall performance of the associated system. Furthermore, one factor defining the performance and/or capabilities of a metal-oxide-semiconductor field-effect transistor (MOSFET) is the total resistance between the drain and the source when the transistor is powered on (also known as the on resistance ($R_{on}$)). Generally, the lower the on resistance, the better the performance of the associated transistor. Examples disclosed herein implement ultra-low on resistance (e.g., less than 2.5 mΩ) power transistors that are integrated with a controller in a single package to reduce resistance across connections between the controller and the transistors. This is achieved by implementing power transistors using two field-effect transistors (FETs) in a back-to-back arrangement and integrated with the controller in a wafer-level chip scale package (WCSP). As used herein, back-to-back FETs refers to two FETs arranged with a particular circuit topology in which the two FETs have separate sources but that share a common drain. Some example back-to-back FETs disclosed herein also have a particular physical structure in which the two FETs are formed adjacent one another on a single semiconductor (e.g., silicon) substrate. In such examples, the common drain corresponds to the semiconductor substrate and/or an underlying backside metal with the separate sources formed on the opposite side of the substrate and isolated from one another via a trench that extends into the semiconductor substrate between the source metal. The back-to-back arrangement enables current to be blocked from passing through the system in either direction when the FETs are turned off. Integrating the power FETs with a corresponding controller into a single package also provides a much smaller footprint than circuitry with similar functionality implemented in known electronic devices.

While implementing back-to-back power FETs in a WCSP may reduce resistance, such implementations give rise to current crowding in which the distribution of current density throughout the FETs is non-uniform. A non-uniform current density distribution presents challenges for the accurate sensing of current as is often done for power transistors implemented in many known electronic devices. In particular, in many existing electronic devices, the current passing through power transistors is measured based on a voltage drop across a resistor positioned in series with the power transistors. However, sensing current via an external resistor cannot accurately determine the non-uniform current distribution within associated transistors. Examples disclosed herein overcome this challenge by integrating one or more current sensing FETs with the main FETs used to implement the back-to-back power FETs. More particularly, in some examples, the one or more current sensing FETs are significantly smaller than the main power FETs such that the current sensing FETs may be positioned at different locations associated with different current densities within the main power FETs. In this manner, although the current density distribution is non-uniform, an average current across the main power FETs may be more accurately measured and is based on the vertical path of current through the main power FETs rather than an external current passing through a resistor in series with the main power FETs. Further, in some examples, locations where the current is expected to be the highest may also be measured by a particular current sensing FET to monitor peak current values to more accurately identify potential over current situations (e.g., when excess current beyond what is intended or expected is present). Current sensing FETs built into the structure of the main power FETs also provide faster response times than is possible using other known current sensing methods based on external current sensors.

FIG. 1 illustrates an example electronic device 100 constructed in accordance with teachings disclosed herein. In particular, the example electronic device 100 of FIG. 1 includes an example power supply 102, an example central processing unit (CPU) 104, and an example universal serial bus (USB) interface 106. The electronic device 100 may be any type of electronic device such as, for example, a laptop computer, a tablet computer, a desktop computer, a smartphone, a personal digital assistant (PDA), etc. The power supply 102 may be associated with a direct current power source (e.g., a battery) or an alternating current power source. In this example, the USB interface 106 implements power transistors constructed in accordance with teachings disclosed herein. Further detail regarding the implementation of the USB interface 106 is provided in connection with FIG. 2. Although power transistors are described in the context of the example USB interface 106 of FIG. 1, examples disclosed herein may be implemented in any suitable application to switch on or off power. Thus, the inclusion of a USB interface 106 is by way of example only and teachings disclosed herein may additionally or alternatively be implemented for other power applications in electronic devices that may or may not include a USB interface.

Figure 2:
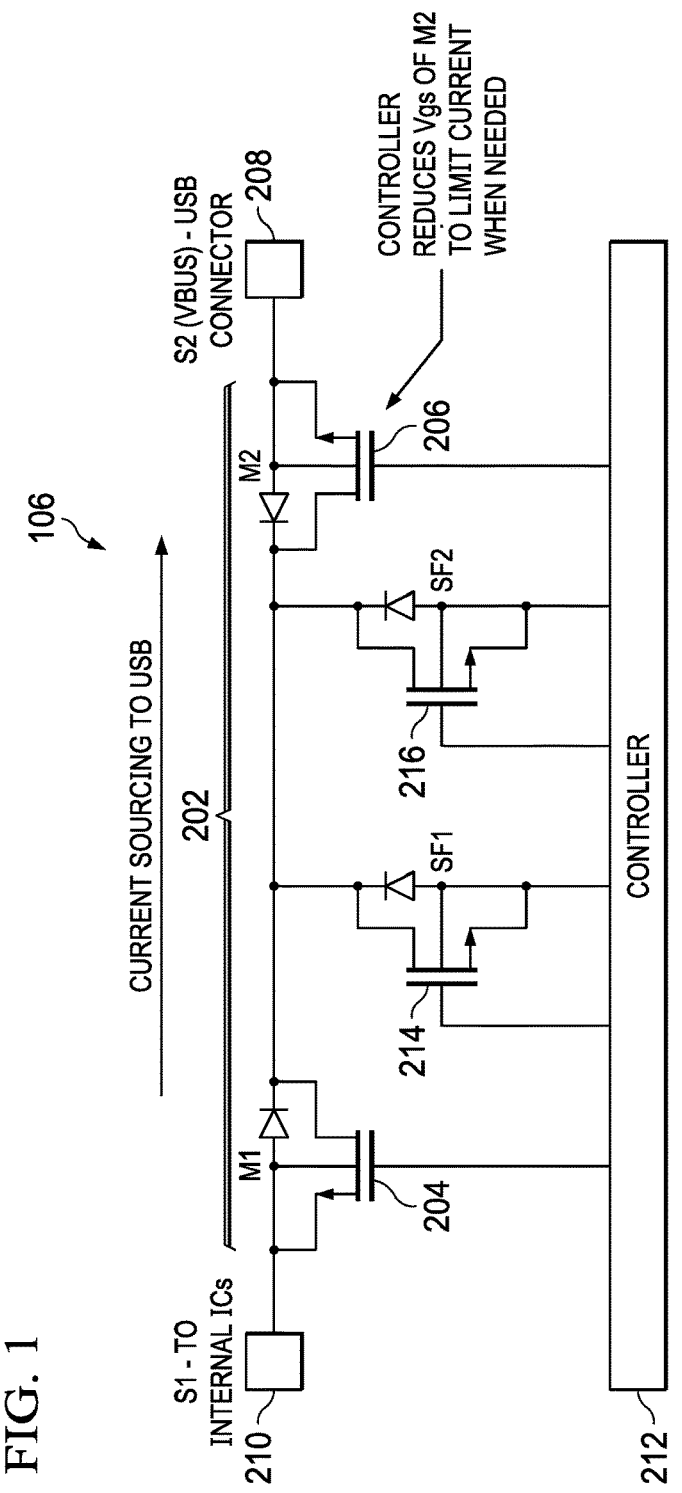
FIG. 2 illustrates an example implementation of the example USB interface of the example electronic device of FIG. 1.

As shown in the illustrated example of FIG. 2, the USB interface 106 includes a power transistor assembly 202 that includes two back-to-back power FETs 204, 206 that serve as the main power FETs (labelled as M1 and M2 in the illustrated example) to switch the delivery of power on and off to an external device connected via a USB connector 208. In some examples, the USB connector 208 corresponds to a USB Type C (USB-C) connector. The power delivered to an external device via the USB connector 208 is obtained from the power supply 102 of FIG. 1 via an internal integrated circuit (IC) connector 210. In some examples, the main power FETs 204, 206 of the power transistor assembly 202 are integrated with an example controller 212 in a single package. The example controller 212 controls when the main power FETs 204, 206 are turned on and turned off. Further, in some examples, the controller 212 may variably adjust (e.g., reduce) the gate-source voltage ($V_{gs}$) for at least one of the main power FETs 204, 206 to limit the current passing through the power transistor assembly 202 when appropriate (e.g., to maintain the current below a certain threshold). In the illustrated example of FIG. 2, the second main power FET 206 is designated as the FET with an adjustable $V_{gs}$.

In some examples, whether the controller 212 turns on, turns off, or otherwise adjusts the current passing through the main power FETs 204, 206 is based on outputs of one or more current sensing FETs 214, 216 (two are shown in the illustrated exampled labeled as SF1 and SF2). In some examples, the current sensing FETs 214, 216 are integrated at different locations within the main power FETs 204, 206 of the power transistor assembly 202 as shown and described below in connection with FIG. 3. Consistent with the description herein, a current sensing FET—can be described as being located within a main power FET when the current sensing FET is at least partially surrounded by a portion of at least one of the main power FET. In one implementation, for example, the current sensing FETs 214, 216 may be located within an outer perimeter of the main power FETs 204, 206. In another implementation, for example, the current sensing FETs 214, 216 may be positioned between at least a portion of the first main power FET 204 and at least a portion of the second main power FET 206. In some examples, the current sensing FETs 214, 216 have a similar structure to the main power FETs 204, 206 and share the same drain as the main power FETs 204, 206.

The example controller 212 of FIG. 2 may be implemented by hardware, software, firmware and/or any combination of hardware, software and/or firmware. Thus, for example, the example controller 212 could be implemented by one or more analog or digital circuit(s), logic circuits, programmable processor(s), programmable controller(s), digital signal processor(s) (DSP(s)), application specific integrated circuit(s) (ASIC(s)), programmable logic device(s) (PLD(s)) and/or field programmable logic device(s) (FPLD(s)). Further, the example USB interface 106 of FIG. 1 may include one or more elements, processes and/or devices in addition to, or instead of, those illustrated in FIG. 2, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 3:
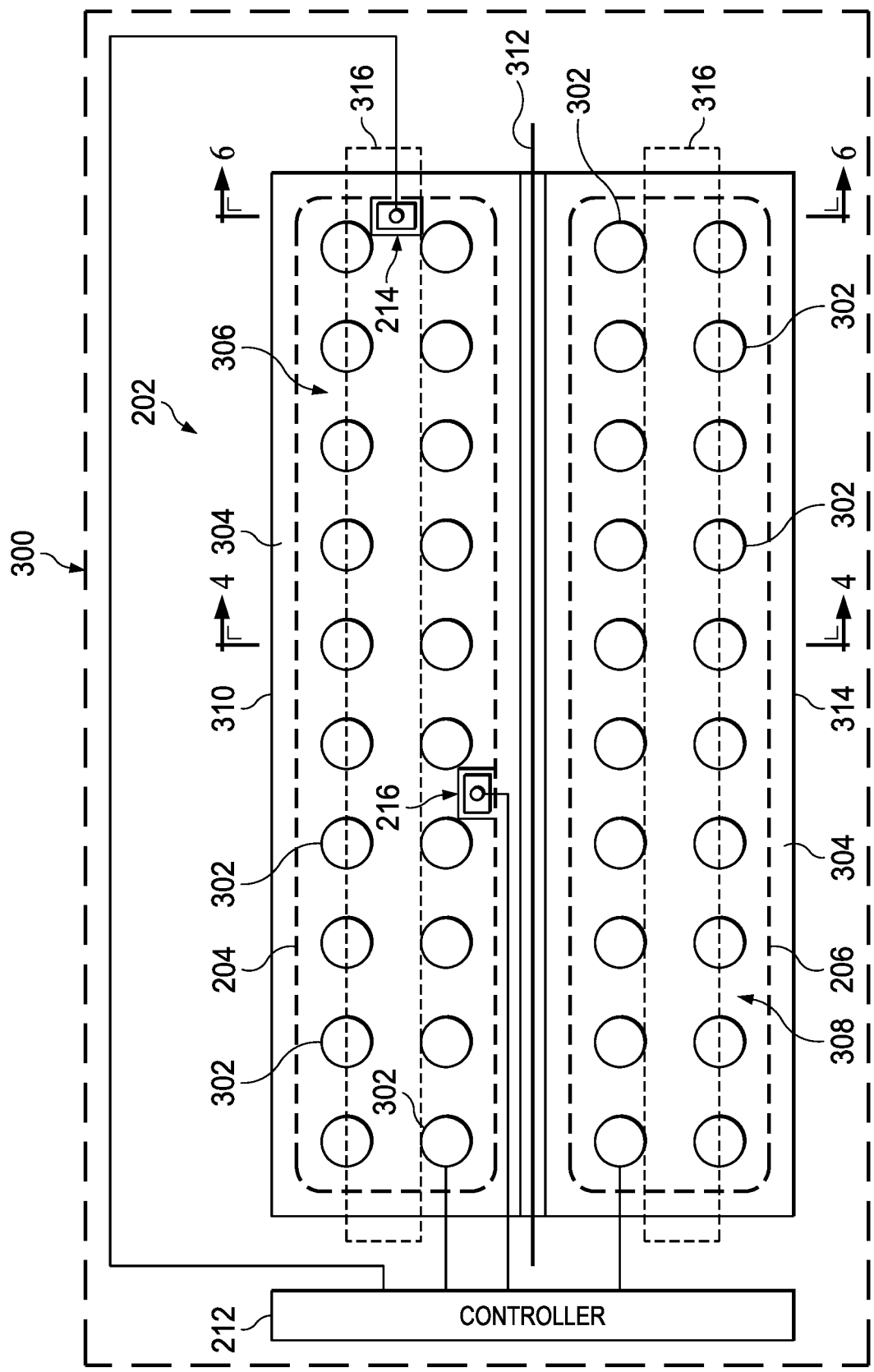
FIG. 3 is a top view of the example power transistor assembly of FIG. 2 integrated with the example controller of FIG. 2 within a single package.

FIG. 3 is a top view of the example power transistor assembly 202 of FIG. 2 integrated with the example controller 212 of FIG. 2 within a single package 300. In some examples, the controller 212 and the power transistor assembly 202 are integrated within a single die. In other examples, the controller 212 and the power transistor assembly 202 may be manufactured on two separate dies that are then integrated within the single package 300. Regardless of whether the controller 212 is included on the same die as the power transistor assembly 202, the controller 212 is communicatively coupled to each of the main power FETs 204, 206 and each of the current sensing FETs 214, 216 as illustrated in FIG. 3. Although the controller 212 and the power transistor assembly 202 are shown as being integrated into a single package 300 in FIG. 3, in some examples, the controller 212 may be implemented in a first package while the power transistor assembly 202 may be implemented in a second, distinct package.

Turning in detail to the example power transistor assembly 202 illustrated in FIG. 3, the main power FETs 204, 206 include a plurality of source connections 302 corresponding to bumps formed on a top surface of an underlying conductive layer 304 defining the source for each of the main power FETs 204, 206. More particularly, in this example, each of the main power FETs 204, 206 includes 20 source connections 302 arranged in two rows of ten connections extending between opposite ends of the main power FETs 204, 206. In other examples, the main power FETs 204, 206 may be implemented with a different number of rows and/or a different number of connections per row. For instance, in some examples, each power FET 204, 206 may be constructed with only a single row of source connections 302 of any suitable number (e.g., 5, 8, 10, 11, etc.). In other examples, each power FET 204, 206 may be constructed with more than two rows of source connections 302 of any suitable number. Although there are multiple source connections 302, all of the source connections 302 associated with the first main power FET 204 correspond to the same first source 306 and are electrical coupled via the underlying conductive layer 304. Similarly, all the source connections 302 associated with the second main power FET 206 correspond to the same second source 308 and are electrically coupled via the associated underlying conductive layer 304. In some examples, at least one of the circles associated with each source 306, 308 designated as sources connections 302 in FIG. 3 may be isolated from the corresponding source 306, 308 and serve as the gate for the corresponding source.

Figure 4:
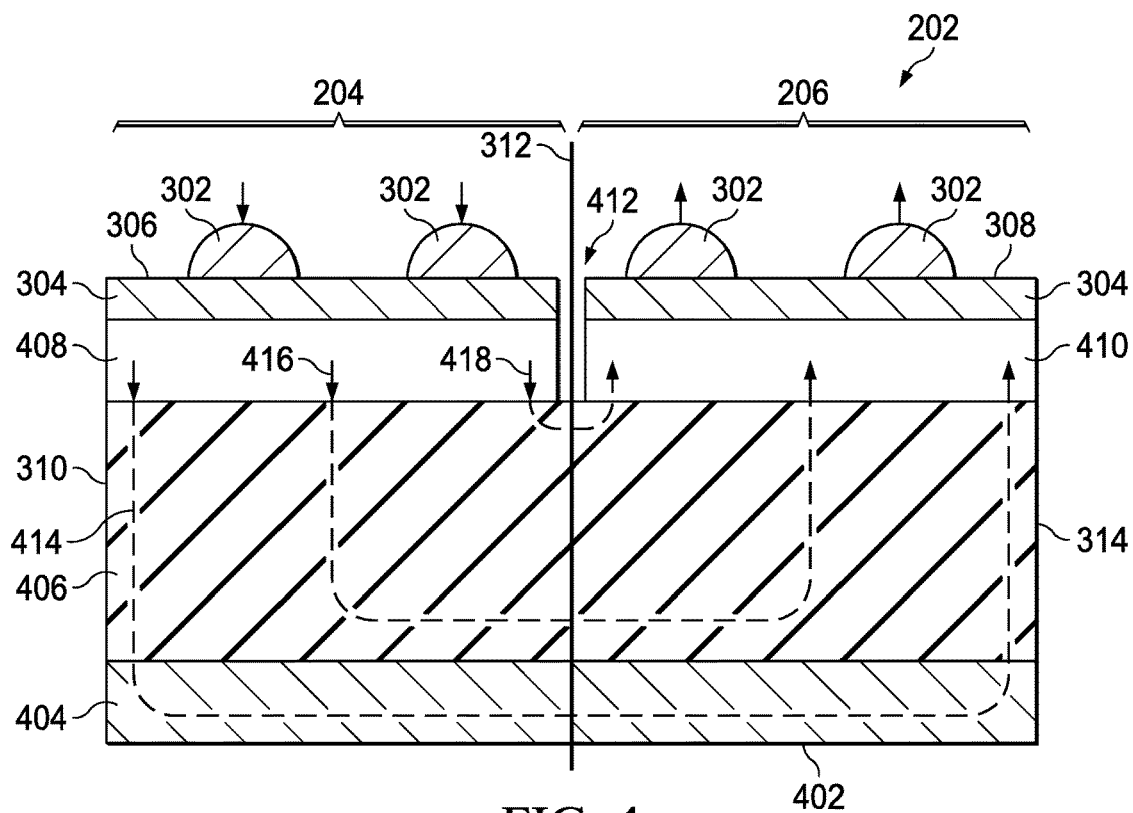
FIG. 4 is a cross-sectional view of the example power transistor assembly of FIG. 3 taken along the line 4-4.

Although the first and second main power FETs 204, 206 have separate sources, they are constructed in a back-to-back arrangement with a common drain 402 as shown in the cross-sectional view of FIG. 4. More particularly, the example first and second main power FETs 204, 206 are vertical FETs in which the sources 306 are adjacent one another on a first side of a substrate 406 and vertically displaced from or above the common drain 402 located on the opposite side of the substrate 406. That is, as shown in the illustrated example of FIG. 4, the drain 402 for both main power FETs 204, 206 corresponds to a backside metal (BSM) 404 located on a bottom (back) side of the substrate 406. The BSM may include any suitable metal such as, for example, silver. The substrate 406 may include any suitable semiconductor such as, for example, silicon and/or n-type or p-type silicon. In the illustrated example, first and second doped regions 408, 410 corresponding to the location of the channel for the corresponding power FET 204, 206 are formed on the substrate 406 on the side opposite to the BSM 404. In some examples, the doped regions 408, 410 correspond to a portion of the substrate 406 that has been doped or diffused with any suitable dopant to form either an n-type or a p-type semiconductor. The conductive layer 304 is formed on the doped regions 408, 410 with the source connections 302 formed thereon. The conductive layer 304 may include any suitable metal such as, for example, aluminum. The source connections 302 may include any suitable metal in any suitable shape such as, for example, solder balls.

As shown in the illustrated example of FIGS. 3 and 4, the first source 306 of the first main power FET 204 extends between a first lateral side 310 of the example power transistor assembly 202 and a central axis or plane 312 of the example power transistor assembly 202. The second source 308 of the second main power FET 206 is positioned on the opposite side of the central plane 312 and extends between a second lateral side 314 of the example power transistor assembly 202 and the central plane 312. As shown in the illustrated example, the first and second sources 306, 308 and the corresponding first and second doped regions 408, 410 are separated by a trench 412. In some examples, the trench 412 may extend into the substrate 406 below the doped regions 408, 410. In some examples, the trench 412 may be filled with any suitable dielectric material to insulate and/or isolate the separate sources 306, 308 corresponding to the two main power FETs 204, 206.

With the sources 306, 308 for the main power FETs 204, 206 on the top side of the power transistor assembly 202 and the drain 402 on the back side of the assembly, the FETs 204, 206 are vertical FETs with the current travelling in a vertical direction through the doped regions 408, 410. However, the current path is not consistent throughout the power transistor assembly 202, but changes depending on the distance from the central plane 312 at which the current leaves (or enters) the first source 306 and travels to (or from) the second source 308. Different example current paths are represented by the arrows shown in FIG. 4. In this example, the current is represented as originating at the first FET 204 and travelling to the second FET 206. In other situations, the direction of current may be reversed. In any event, at the outer extremities (e.g., towards the lateral sides 310, 314) of the power transistor assembly 202, the current may follow a substantially vertically path down from the first source 306 through the substrate 406 and then travel laterally across the drain 402 before travelling substantially vertically up through the substrate 406 to reach the second source 308 as represented by the first current path 414. As used in this context, the vertical direction is defined as being orthogonal to the plane of the substrate 406 on which the main power FETs 204, 206 are formed. Thus, as used herein, a "substantially vertically" current path refers to a current path that is within some threshold (e.g., 5 degrees, 10 degrees, etc.) of 90 degrees from the plane of the substrate 406. Current that enters the substrate 406 closer to the central plane 312 (e.g., near a midpoint between the central plane 312 and the first lateral side 310) may follow a second current path 416 that extends a substantial depth into the substrate 406 without reaching the BSM 404 (e.g., the drain 402) before travelling laterally and then returning to the second source 308. Current that enters the substrate 406 at a location adjacent the central plane 312 between the FETs 204, 206 may follow a third current path 418 in which the current primarily travels laterally across the substrate 406 beneath the trench 412 to reach the other source. As represented in the illustrated example, some current paths do not extend into the BSM 404. In some examples, the BSM 404 may be omitted with the substrate 406 serving as the drain 402 for the main power FETs 204, 206.

Figure 5:
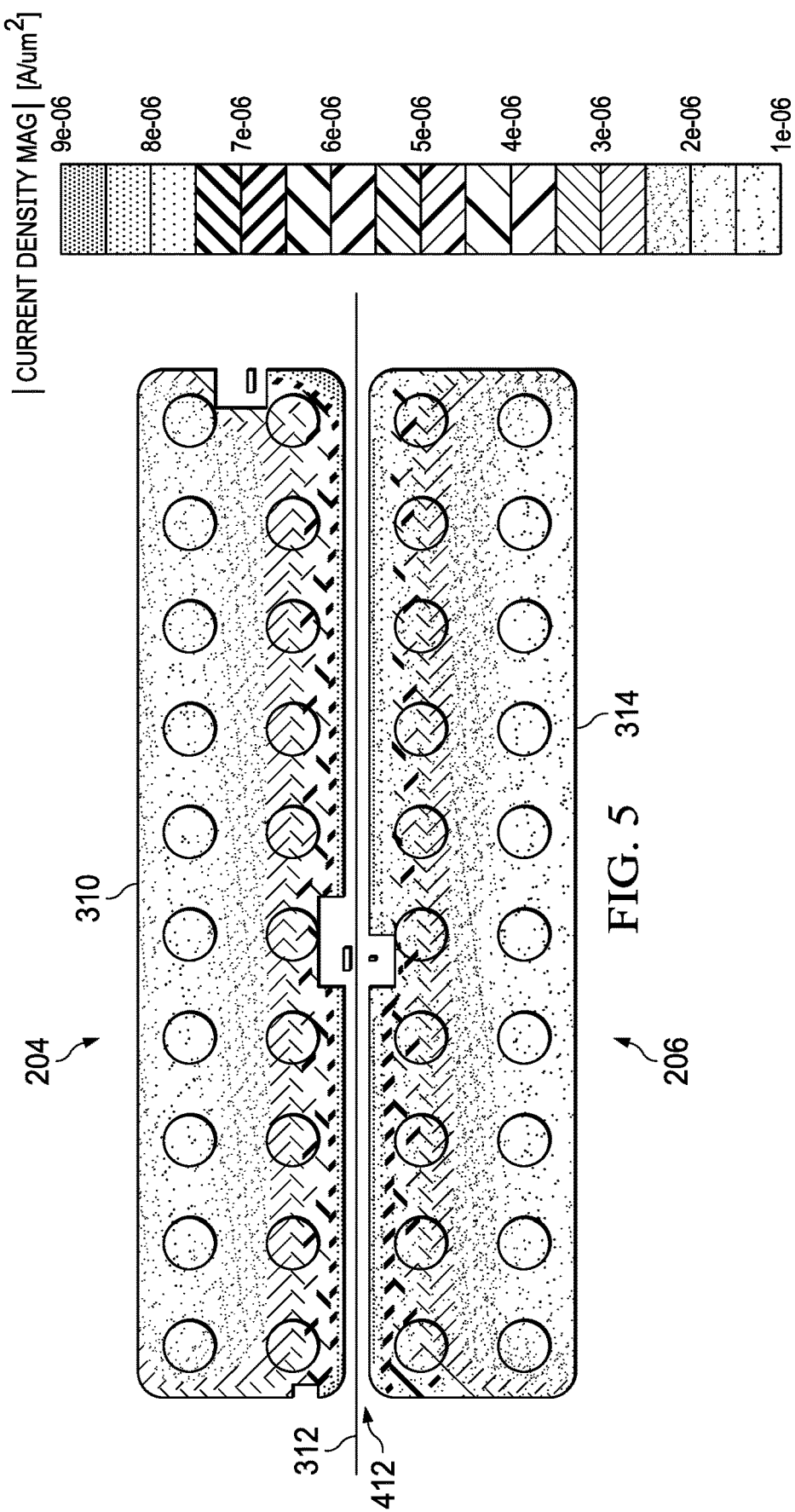
FIG. 5 is a diagram of an example current density distribution across an XY plane within the doped regions of the example power transistor assembly of FIG. 3.

The non-uniform current path between the sources of the two main power FETs 204, 206 results in a non-uniform current density distribution across the power transistor assembly 202. FIG. 5 is a diagram illustrating an example current density distribution in an XY plane within the doped regions 408, 410 of the example power transistor assembly 202 of FIGS. 2-4. As represented in the diagram of FIG. 5, the current is the highest at inner edges of the main power FETs 204, 206 adjacent the central plane 312 and decreases at locations farther away from the central plane 312 and towards the lateral sides 310, 314. The relatively high current near the central plane 312 is due to the relatively small resistance of the short current path (e.g., the path 418 of FIG. 4) between the inner edges of the doped regions 408, 410 of the two main power FETs 204, 206 adjacent the central plane 312. By contrast, the lower currents at distances farther way from the central plane 312 are due to the larger resistance of the longer current paths (e.g., the paths 414, 416 of FIG. 4) associated with the outer extremities of the FETs 204, 206. In addition to the current density distribution varying across the XY plane as shown in FIG. 5, the current density distribution may also vary in the Z direction (e.g., at different depths within the substrate 406).

In many circumstances, it is desirable to measure the current passing through a power transistor. This is often done using a current sensing FET. A challenge with this approach for the example power transistor assembly 202 of the illustrated examples is that the current that is measured will depend on where the current sensing FET is located.

The closer the current sensing FET is located to the central plane 312, the higher the detected current will be. Conversely, the farther the current sensing FET is located from the central plane 312, the lower the detected current will be.

For accurate measurements, the substrate resistance matches the resistance of the current sensing FET. In some examples, this is accomplished by constructing the current sensing FETs 214, 216 using a similar structure (and using the same material) as the main power FETs 204, 206 and located where the current is approximately average of the total current distribution. As used herein, approximately average can be understood as being within some threshold (e.g., 10%) of the average. In some examples, the current is approximately average of the total current distribution in a middle third region 316 of each FET 204, 206 as shown in FIG. 3. That is, in some examples, a current sensing FET (e.g., the first current sensing FET 214) is located a distance from the central plane 312 between approximately one third and two thirds of the total distance between the central plane 312 and the corresponding lateral side 310, 314. In some examples, where the main power FETs 204, 206 include two rows of source connections 302 (as shown in FIG. 3), the current sensing FET 214 is located a distance from the central plane 312 between the two rows of source connections 302. In other words, in some examples, the current sensing FET 214 is located to be surrounded by one of the main power FETs 204, 206 and spaced apart from the other power FET.

The first current sensing FET 214 may be placed in any suitable position along the length of the middle third region 316 because the current distribution is substantially uniform along the longitudinal direction of the main power FETs 204, 206. In some examples, the manufacturing processes to fabricate the first current sensing FET 214 may be simplified if positioned at one end of the main power FETs 204, 206. Accordingly, in the illustrated example of FIG. 3, a first current sensing FET 214 is located within the third region 316 associated with the first main power FET 204 at one end of the power FET. In some examples, the current within the middle third region 316 of the substrate 406 of the first main power FET 204 is approximately the same as the current within the middle third region 316 of the substrate 406 of the second main power FET 206. As such, in some examples, the first current sensing FET 214 may alternatively be placed in the third region 316 of the second main power FET 206. In some examples, different current sensing FETs may be placed in the middle third regions 316 of both main power FETs 204, 206. In some examples, more than one current sensing FET may be placed in the middle third region 316 of one of the main power FETs 204, 206. In some such examples, the different current sensing FETs may be placed at different locations along the longitudinal length of the corresponding main power FET. In some examples, multiple current sensing FETs may be placed at different locations on a single main power FET at different distances from the central plane 312. In some such examples, the different current sensing FETs may all be positioned within the middle third region 316 of the main power FET. In other such examples, one or more of the current sensing FETs may be positioned outside of the middle third region 316.

In some examples, when only one current sensing FET (e.g., the current sensing FET 214 of FIG. 3) is used across both main power FETs 204, 206, the current sensing FET 214 is located within the main power FET that remains in the linear region during operation and does not reach saturation. As mentioned above in connection with FIG. 2, the controller 212 is able to variably adjust (e.g., reduce) the $V_{gs}$ of the second main power FET 206 to limit current passing through the power transistor assembly 202. As the $V_{gs}$ of the second main power FET 206 decreases, the drain-source voltage ($V_{gs}$) increases and may go into saturation. By contrast, since the first main power FET 204 is either turned fully on or fully off, the first main power FET 204 operates in the linear region. In such examples, as shown in FIG. 3, the first current sensing FET 214 is located on the first main power FET 204 because the first main power FET 204 will not enter saturation.

Figure 6:
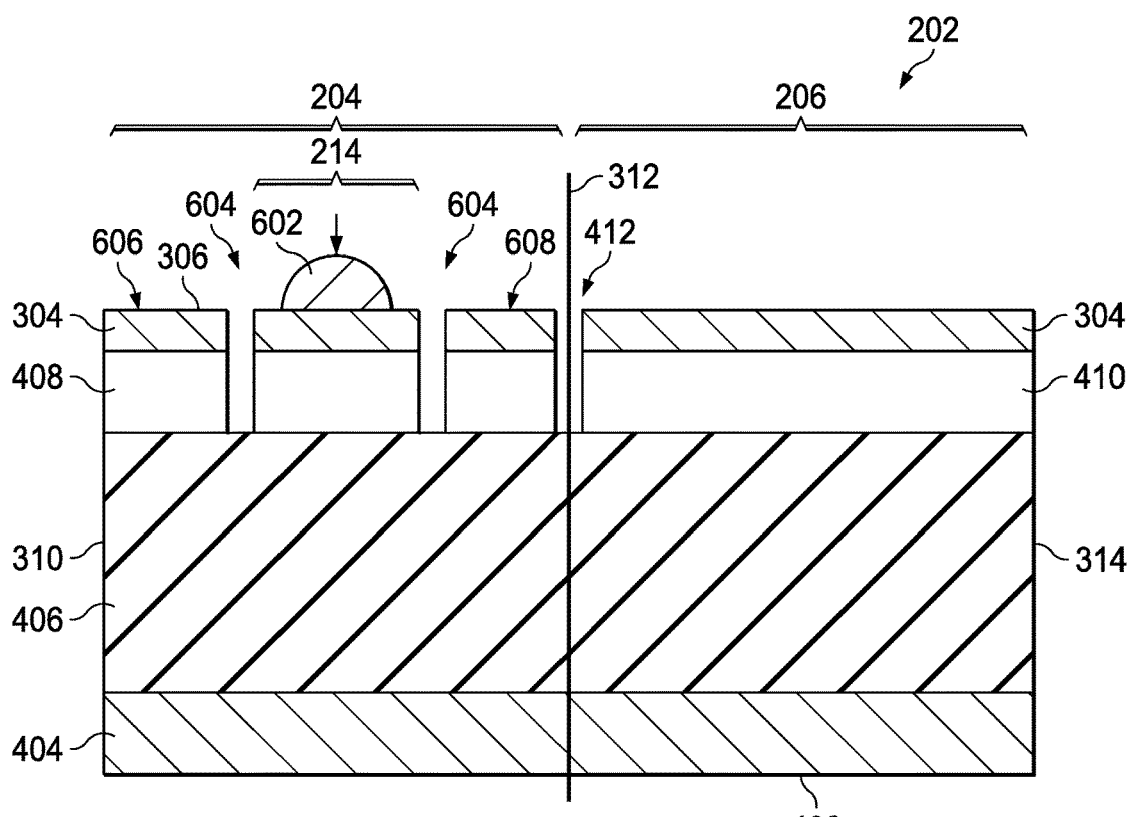
FIG. 6 is a cross-sectional view of the example power transistor assembly of FIG. 3 taken along the line 6-6.

The structure of the first current sensing FET 214 is substantially similar to the structure of the first main power FET 204 except for its size as shown in the cross-sectional view of the example power transistor assembly 202 shown in FIG. 6 taken along the line 6-6 of FIG. 3. As shown in the illustrated example of FIG. 6, the relatively small first current sensing FET 214 is formed in the structure of the much larger first main power FET 204 with a source connection 602 on the same conductive layer 304 that is on the same doped region 408 on the substrate 406. Further, the current sensing FET 214 shares the same drain 402 that is common between both the first and second main power FETs 204, 206. The first current sensing FET 214 is electrically isolated from the first main power FET 204 based on trenches 604 etched through the conductive layer 304 and the doped region 408. In some examples, the trenches 604 are filled with a dielectric material. As shown in the illustrated example of FIG. 6, the first current sensing FET 214 is positioned between first and second portions 606, 608 of the first source 306 of the first main power FET 204.

Figure 7:
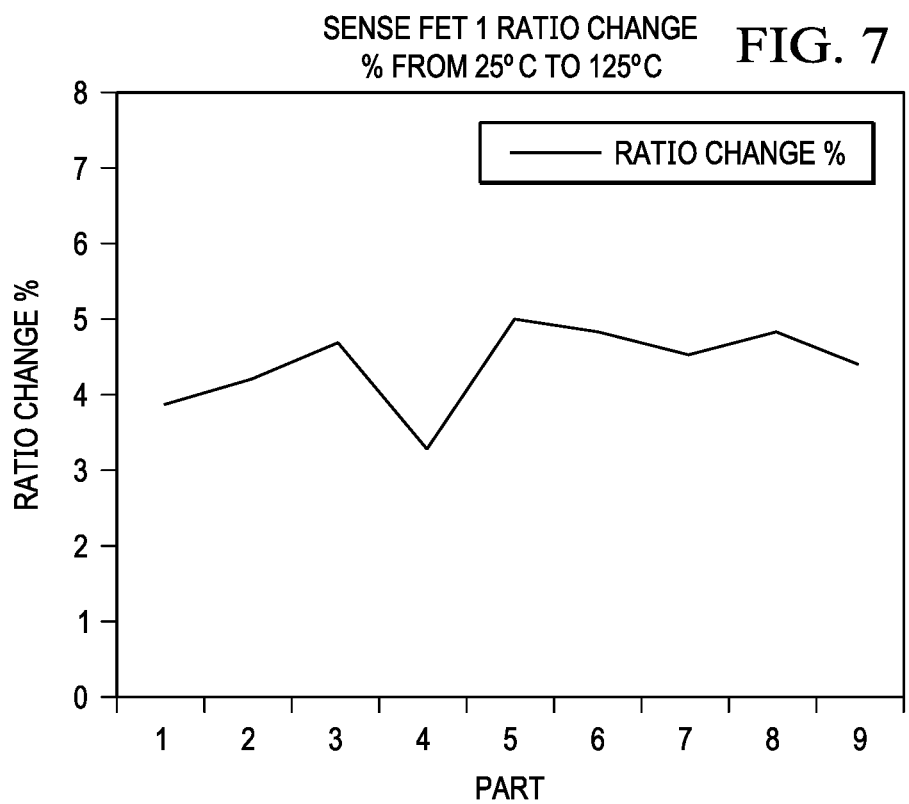
FIG. 7 is a graph illustrating the percent change in ratio of the resistance of the first current sensing FET to the main power FETs in FIGS. 2 and 3 when changing temperatures from 25° C. to 125° C.
Figure 8:
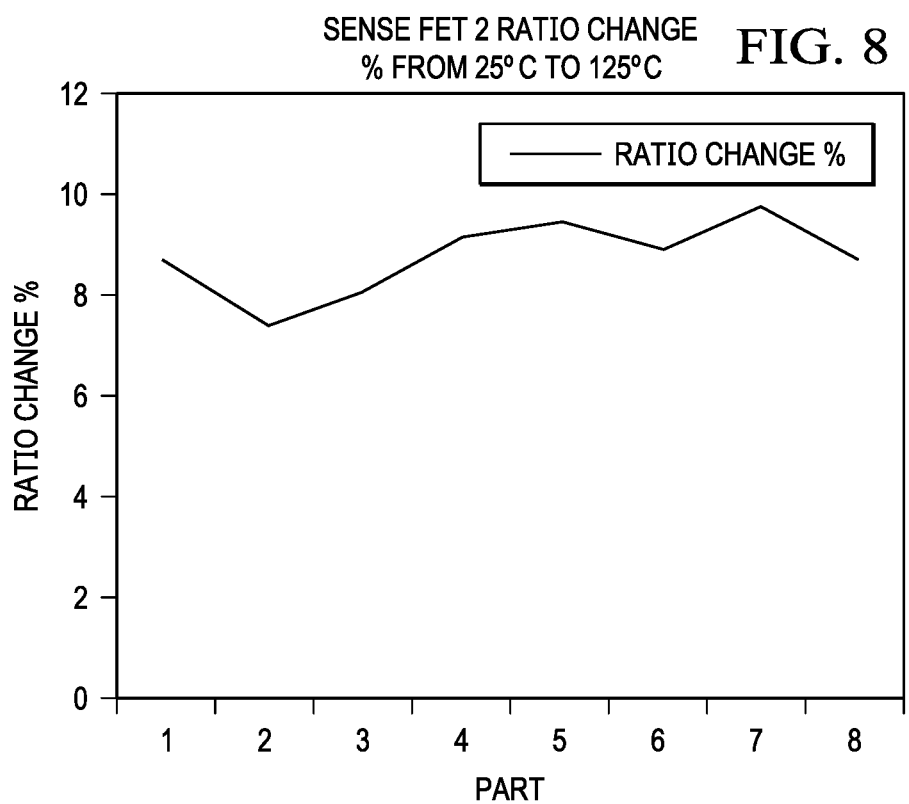
FIG. 8 is a graph illustrating the percent change in ratio of the resistance of the second current sensing FET to the main power FETs in FIGS. 2 and 3 when changing temperatures from 25° C. to 125° C.

The first current sensing FET 214, positioned as shown in FIG. 3 within the middle third region 316 of the first main power FET 204, enables an accurate determination of the average current in the power transistor assembly 202 relative to the total current distribution during normal operations. A significant factor affecting the accuracy of a current sensing FET is the temperature at which the current sensing FET and the associated main power FET are operating because the properties of the FETs change with temperature. FIG. 7 is a graph illustrating the percent change in ratio of the resistance of the first current sensing FET 214 to the resistance of the main power FETs 204, 206 when at 25° C. versus 125° C. By contrast, FIG. 8 is a graph illustrating the percent change in ratio of the resistance of the second current sensing FET 216 to the resistance of the main power FETs 204, 206 when at 25° C. versus 125° C. As shown with reference to the graphs in FIGS. 7 and 8, the percentage change in the ratio for a temperature change from 25° C. to 125° C. for the first current sensing FET 214 is approximately half the percentage change in ratio for the second current sensing FET 216. Less change in the ratio corresponds to more accurate measurements. Accordingly, the location of the first current sensing FET 214 in the middle third region 316 of the first main power FET 204 provides greater accuracy in measuring current as compared with the second current sensing FET 216 located near the central plane 312.

While the location of the first current sensing FET 214 provides accurate current measurements under normal operating conditions, the first current sensing FET 214 cannot accurately detect over current conditions. As mentioned above in connection with FIG. 5, the current is the highest at the inner edges of the main power FETs 204, 206 adjacent the central plane 312 as defined by the trench 412 and is highest at corresponding locations within the substrate 406 underlying the trench 412. The high current crowding near the central plane 312 in an over current condition may cause the power transistor assembly 202 to over heat, particular in the area proximate the central plane 312. The increased temperature of the power transistor assembly 202 disrupts the match of resistance between the first current sensing FET 214 and the corresponding main power FET 204. As a result, current measurements by the first current sensing FET 214 in such conditions would not be accurate or reliable. Furthermore, when detecting over current conditions it is desirable to detect the highest current that is present. However, the first current sensing FET 214 is positioned to detect the average current rather than the highest, thereby further undermining the current sending FET's ability to reliably detect over current conditions. Accordingly, in some examples, a second current sensing FET 216 is positioned within the power transistor assembly 202 at or near the central plane 312 as shown in FIG. 3 where the current is highest. More particularly, in some examples, the second current sensing FET 216 is located a distance from the central plane 312 that is within 10% of the total distance between the central plane 312 and one of the lateral sides 310, 314.

While the current is substantially consistent along the longitudinal length of the power transistor assembly 202, the current may be slightly higher near the middle of the assembly away from the ends. This is particular so in over current conditions because the properties of the FETs change as the temperature rises and the highest temperatures are likely to be near the middle of the power transistor assembly 202 where the current is also the highest. Accordingly, in this example, the second current sensing FET 216 is located towards the middle of the power transistor assembly 202. More particularly, in some examples, the second current sensing FET 216 is located within a middle two thirds of the power transistor assembly 202 extending in the longitudinal direction.

The structure of the second current sensing FET 216 is substantially similar to the structure of the first current sensing FET 214 shown in FIG. 6 except that the second current sensing FET 216 is positioned closer to the central plane 312 and the trench 412. In the illustrated example FIG. 3, the second current sensing FET 216 is located on the same side of the central plane 312 as the first current sensing FET 214 (e.g. surrounded by the first main power FET 204. In other examples, the second current sensing FET 216 may be placed on the opposite side of the central plane 312 to be located within the second main power FET 206. In other examples, separate current sensing FETs may be placed on either side of the central plane 312. As shown in the illustrated example, the second current sensing FET 216 is not positioned directly in line with the central plane 312 because the current sensing FET is formed within the associated main power FET and spaced apart from the central plane 312 due to the trench 412. However, in this example, the second current sensing FET 216 is directly adjacent the trench 412.

In some examples, the power transistor assembly 202 includes both the first current sensing FET 214 (positioned in the middle third region 316 where the current is average) to accurately monitor current under normal operating conditions and the second current sensing FET 216 (positioned at or near the central plane 312 where the current is the highest) to reliably detect over current conditions. In other examples, only one of the first or second current sensing FETs 214, 216 may be included in the power transistor assembly 202. In other examples, additional current sensing FETs may be included in the power transistor assembly 202 to provide redundancy and/or additional measurement points that may be averaged and/or combined in any suitable manner. While general regions in which the current sensing FETs 214, 216 have been disclosed above, precise locations for a particular power transistor assembly design may be determined by performing a finite element analysis of the particular design.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

From the foregoing, it will be appreciated that example methods, apparatus and articles of manufacture have been disclosed that enable the implementation of a power switching component (e.g., a USB interface) with a power transistor assembly and associated controller with a smaller formfactor than is currently available in other known electronic devices. The small formfactor is achieved by integrating two back-to-back power FETs with the associated controller into a single package. Further, examples disclosed herein enable the accurate measurement of the average current passing through the main power FETs despite the fact that the current density distribution across the FETs is non-uniform based on their structure and mode of operation. Accurate current measurements are accomplished by implementing one or more current sensing FETs at a location within the main power FETs where the current is expected to be average during normal operating conditions. In some examples, accurate detection of over current conditions is achieved by implementing one or more current sensing FETs at a location within the main power FETs where the current is expected to be highest. Not only do the current sensing FETs at the locations disclosed herein provide more accurate monitoring of current conditions in the main power FETs than other known current sensing techniques, but the current sensing FETs can also provide faster response times than other known techniques to enable the associated controller to respond more quickly as appropriate, thereby improving the operation of the system.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An apparatus comprising:
   a transistor assembly including back-to-back field-effect transistors (FETs) having respective doped regions and sources and sharing a drain and including a current sensing FET having a respecting doped region and a source at least partially surrounded by the respective doped region and source of one of the FETs, and a trench at least partially surrounding and separating the doped region and the source of the current sensing FET from the doped region and the source of the one of the FETs; and
   a controller to control operation of the FETs, the FETs integrated with the controller in a single package.

2. The apparatus of claim 1, wherein a first portion of the doped region and source of a first one of the FETs is closer to the doped region and source of a second one of the FETs than the doped region and source of the current sensing FET, and a second portion of the doped region and source of the first FET is farther from the doped region and source of the second FET than the doped region and source of the current sensing FET.

3. The apparatus of claim 2, wherein the first portion extends at least one third a distance between an inner edge of the first FET proximate the second FET and an outer lateral side of the first FET distal the second FET, the second portion to extend at least one third the distance between the inner edge of the first FET and the outer lateral side of the first FET.

4. The apparatus of claim 1, wherein the current sensing FET is at a first distance from an interface of the FETs that is within 10 percent of a second distance extending between outer lateral sides of the FETs.

5. An electronic device comprising:
   a universal serial bus (USB) connector;
   a circuitry;
   a first connector coupled to the circuitry;
   a substrate having a first side and a second side opposite the first side;
   a first field-effect transistor (FET) having a first doped region on the first side of the substrate and a first source on the first doped region;
   a second FET having a second doped region on the first side of the substrate and a second source on the second doped region, the first and second FETs sharing a drain on the second side of the substrate, the first and second FETs electrically coupled between the USB connector and the first connector; and
   a current sensing FET having a third doped region on the first side of the substrate and a third source on the third doped region, the third source at least partially surrounded by the first source of the first FET, the third doped region at least partially surrounded by the first doped region of the first FET.

6. The electronic device of claim 5, further comprising a controller configured to control the first and second FETs based on an output of the current sensing FET.

7. The electronic device of claim 5, wherein the USB connector is a USB-C connector.

8. The electronic device of claim 5, wherein the first and second sources extend longitudinally side-by-side between first and second ends and extend laterally away from one another toward respective first and second lateral sides, and the current sensing FET is between the first and second ends and between the first and second lateral sides.

9. The electronic device of claim 8, wherein the current sensing FET is proximate a central plane extending longitudinally between the first and second sources.

10. The electronic device of claim 8, wherein the first source includes an inner third region proximate the second source, an outer third region proximate the first lateral side, and a middle third region between the inner third region and the outer third region, and the third doped region and third source of the current sensing FET are adjacent to the middle third region.

11. The electronic device of claim 8, wherein the current sensing FET is a first current sensing FET, the electronic device further comprising a second current sensing FET having a fourth doped region on the first side of the substrate and a fourth source on the fourth doped region, the fourth doped region at least partially surrounded by the first doped region or the second doped region, and the fourth source at least partially surrounded by the first source or the second source between the first and second ends and between the first and second lateral sides, the first current sensing FET a first distance from the first lateral side and the second current sensing FET a second distance from the first lateral side different than the first distance.

12. An apparatus comprising:
a substrate having a first side and a second side opposite the first side;
a first field-effect transistor (FET) having a first doped region on the first side of the substrate and a first source on the first doped region;
a second FET having a second doped region on the first side of the substrate and a second source on the second doped region, the first and second FETs sharing a drain on the second side of the substrate; and
a current sensing FET having a third doped region on the first side of the substrate and a third source on the third doped region, the third source at least partially surrounded by the first source of the first FET, the third doped region at least partially surrounded by the first doped region of the first FET, and a trench at least partially surrounding and separating the third doped region and the third source from the first doped region and the first source.

13. The apparatus of claim 12, wherein the current sensing FET and the first and second FETs share the drain.

14. The apparatus of claim 12, wherein:
the trench is a first trench;
and the first source and the first doped region are separated from the second source and the second doped region by a second trench extending in a longitudinal direction along a central plane between the first and second FETs,
the first source and the first doped region extending away from the central plane to a first lateral side,
the second source and the second doped region extending away from the central plane to a second lateral side opposite the first lateral side.

15. The apparatus of claim 14, wherein the current sensing FET is between one third and two thirds of a distance between the central plane and the first lateral side.

16. The apparatus of claim 14, wherein the current sensing FET is at a distance from the central plane no more than 10 percent of a distance between the first lateral side and the central plane.

17. The apparatus of claim 14, wherein the first source includes a row of source connections aligned along the longitudinal direction between first and second ends of the first source, the source connections protruding from an underlying conductive surface.

18. The apparatus of claim 17, wherein the current sensing FET is closer to the first end of the first source than any of the source connections.

19. The apparatus of claim 17, wherein a first one of the source connections is closer to the first end of the first source than the third source and third doped region of the current sensing FET.

20. The apparatus of claim 17, wherein
the row of source connections is a first row of source connections,
and the first source includes a second row of source connections aligned along the longitudinal direction, the second row of source connections is farther from the central plane than the first row of source connections,
the current sensing FET is farther from the central plane than the first row of source connections and closer to the central plane than the second row of source connections.

21. The apparatus of claim 12, further comprising:
a controller configured to control operation of the first and second FETs based on an output of the current sensing FET; and
a package within which the first and second FETs and the current sensing FET are integrated.

22. The apparatus of claim 21, wherein the controller is configured to variably adjust a gate-source voltage of the second FET.

23. The apparatus of claim 12, wherein the current sensing FET is a first current sensing FET,
the apparatus further including a second current sensing FET having a fourth doped region on the first side of the substrate and a fourth source on the fourth doped region, the fourth doped region at least partially surrounded by the first doped region or the second doped region, and the fourth source at least partially surrounded by the first source or the second source,
the third source is at a first distance from a plane extending between the first and second sources,
the fourth source is at a second distance from the plane, wherein the first distance is greater than the second distance.

24. The apparatus of claim 12, wherein:
the first and second sources extend longitudinally side-by-side between first and second ends and extend laterally away from one another toward respective first and second lateral sides; and
the first source includes an inner third region proximate the second source, an outer third region proximate the first lateral side, and a middle third region between the inner third region and the outer third region, and the source of the current sensing FET is between the inner third region and the outer third region.

25. The apparatus of claim 12, wherein:
the first and second sources extend longitudinally side-by-side between first and second ends and extend laterally away from one another toward respective first and second lateral sides; and the first source includes an inner third region proximate the second source, an outer third region proximate the first lateral side, and a middle third region between the inner third region and the outer third region, and the source of the current sensing FET is at least partially surrounded by the inner third region.

26. The apparatus of claim 12, wherein: the substrate having a non-uniform current density distribution as a current passes between the first and second FETs; and
the third doped region is at a first location.

27. The apparatus of claim 26, wherein the substrate is to provide a first current path for the current between first portions of the first and second doped regions to extend laterally through the substrate at a first depth, a second current path for the current between second portions of the first and second doped regions to extend laterally through the substrate at a second depth greater than the first depth, and a third current path for the current between third portions of the first and second doped regions to extend laterally through the substrate at a third depth greater than the second depth.

28. The apparatus of claim 27, wherein the second and third current paths are to extend substantially vertically into the substrate away from the corresponding second and third portions of the first doped region before extending laterally through the substrate at the corresponding second and third depths.

29. The apparatus of claim 27, wherein the first portions of the first and second doped regions are closer together than the second portions, and the second portions are closer together than the third portions.

30. The apparatus of claim 29, wherein the current density distribution is different when the first and second FETs are in an over current condition relative to when the first and second FETs are in a normal operating condition, the current density distribution exhibiting higher current crowding proximate the first portions of the first and second doped regions during the over current condition than during the normal operating condition.

31. The apparatus of claim 27, wherein the first current path corresponds to a higher current in the current density distribution than the second current path, and the second current path corresponds to a higher current in the current density distribution than the third current path.

32. The apparatus of claim 27, wherein the first current path corresponds to a highest current in the current density distribution, the first location is proximate the first current path.

33. The apparatus of claim 27, wherein the second current path corresponds to an average current in the current density distribution relative to a total current passing between the first and second FETs, the first location is proximate the second current path.

34. The apparatus of claim 27, wherein the current sensing FET is a first current sensing FET, the apparatus further including a second current sensing FET having a respective source and a fourth doped region between its source and the substrate at a second location, the fourth doped region at least partially surrounded by the first doped region or the second doped region, the first location is proximate the first current path, and the second location is proximate the second current path.

* * * * *